United States Patent [19]

Yoshitome et al.

[11] Patent Number: 4,694,251

[45] Date of Patent: Sep. 15, 1987

[54] METHOD AND APPARATUS FOR NUCLEAR MAGNETIC RESONANCE IMAGING

[75] Inventors: Eiji Yoshitome; Kazuya Hoshino, both of Tokyo, Japan

[73] Assignee: Yokogawa Medical Systems, Limited, Tokyo, Japan

[21] Appl. No.: 840,570

[22] PCT Filed: Jul. 2, 1985

[86] PCT No.: PCT/JP85/00370

§ 371 Date: Feb. 21, 1986

§ 102(e) Date: Feb. 21, 1986

[87] PCT Pub. No.: WO86/00706

PCT Pub. Date: Jan. 30, 1986

[30] Foreign Application Priority Data

Jul. 3, 1984 [JP] Japan ................... 59-137004

[51] Int. Cl.$^4$ ............................... G01R 33/20
[52] U.S. Cl. ..................... 324/309; 324/307
[58] Field of Search ............... 324/300, 306, 307, 309, 324/312, 311, 313, 314

[56] References Cited

U.S. PATENT DOCUMENTS

| | | | |
|---|---|---|---|
| 4,486,709 | 12/1984 | Bendall | 324/314 |
| 4,506,222 | 3/1985 | Edelstein | 324/309 |
| 4,527,124 | 7/1985 | Van Uijen | 324/307 |
| 4,532,474 | 7/1985 | Edelstein | 324/312 |
| 4,602,214 | 7/1986 | Edelstein | 324/309 |

Primary Examiner—Michael J. Tokar
Attorney, Agent, or Firm—Moonray Kojima

[57] ABSTRACT

A method and apparatus are disclosed for nuclear magnetic resonance imaging utilizing the Fourier transform imaging scan sequence, with measurement data being obtained from which the offects of variations in the static magnetic field are eliminated. The method and apparatus are characterized by measurement of view data G(k,t) for a body which is under diagnosis under the condition that there is a specific value of twist of spin phase within the body, in a specific direction, measurement of the view data G(−k,t) for the body which is under diagnosis under the condition that the value of twist of the spin phase within the body is equal in amount and of opposite direction to the aforementioned value of twist of spin phase, with the time which elapses between the measurements of G(k,t) and G(−k,t) being made sufficiently short that any change in the static magnetic field occurring therein can be ignored, deriving from the view data G(k,t) and G(−k,t) the data $G(k,t_0)$ and $G(-k,-t_0)$, for the respective time points $t_0$ and $-t_0$ which are mutually symmetrically disposed with respect to the time origin, deriving the complex conjugate $\overline{G}(-\overline{k},-\overline{t}_0)$ of the data $G(-k,-t_0)$, deriving the ratio A which is equal to $G(k,t_0)/\overline{G}(-\overline{k},-\overline{t}_0)$, and correcting measured data by a signal which is proportional to the argument arg(A) of the ratio A.

12 Claims, 4 Drawing Figures

METHOD AND APPARATUS FOR NUCLEAR MAGNETIC RESONANCE IMAGING

TECHNICAL FIELD

The present invention relates to a method and apparatus for nuclear magnetic resonance imaging. More particularly, the present invention relates to a method and apparatus for nuclear magnetic resonance imaging whereby deterioration of image quality as a result of variation with time of the static magnetic field can be eliminated.

BACKGROUND ART

With a resistive magnet type of nuclear magnetic resonance imaging apparatus, a static magnetic field is generated by passing a fixed drive current through a static magnetic field coil. If the resultant static magnetic field is stable, then the 2-dimensional reverse Fourier transform can be applied to the measured data for thereby correctly reconstructing a image of the body of an individual under diagnosis, with an image of good quality being obtained.

However even if the power source used to generate the static magnetic field is extremely stable, so that stable constant-current drive is applied, the static magnetic field can vary by several p.p.m due to changes in the shape of the static magnetic field coil as a result of variations in the ambient temperature. For this reason, artifacts will be produced in the image which is obtained, rendering it impossible to derive a satisfactory 2-dimensional Fourier image of the body which is under diagnosis.

Proposals have been made in the prior art for producing nuclear magnetic resonance imaging which will overcome this problem, specifically in Japanese Patent Provisional Publication No. 57-66346 and in Japanese Patent Provisional Publication No. 57-192541. In the case of Japanese Patent Provisional Publication No. 57-66346, a standard specimen is disposed within the static magnetic field, and the amount of variation of the static magnetic field is derived on the basis of an NMR signal which is detected from the standard specimen. The measured data which is obtained for the body which is under diagnosis is corrected, based upon the amount of variation of the static magnetic field that is obtained in this way. However with this method, it is necessary to employ a standard specimen, and a measurement unit for the standard specimen. In the case of Japanese Patent Provisional Publication No. 52-192541, an NMR signal is detected upon cessation of application of a gradient magnetic field to the body which is under diagnosis, and the amount of variation of the static magnetic field is obtained from this NMR signal, whereby the current that is passed through the static magnetic field correction coil is controlled such as to bring the amount of variation of the static magnetic field to zero. With this method it is not necessary to use a test specimen or a measurement unit for the test specimen. However due to the fact that it is necessary to halt application of the gradient magnetic field in order to measure the NMR signal produced by the body which is under diagnosis at the time of cessation of the gradient magnetic field, the measurement sequence must be different from the normal sequence, i.e. a special measurement sequence must be adopted.

DISCLOSURE OF INVENTION

It is an objective of the present invention to provide a method and apparatus for nuclear magnetic resonance imaging whereby it is not necessary to employ a standard specimen and a measurement unit for such a standard specimen, or to utilize a special measurement sequence, in order to obtain the amount of variation of the static magnetic field.

The present invention constitutes a method and apparatus whereby measured data is obtained with the effects of variation with time of the static magnetic field being eliminated therefrom, and employs the scan sequence for the Fourier transform imaging.

The view data $G(k,t)$ for the body which is under diagnosis is measured under the condition that the phase of spin within the body under diagnosis is twisted in one direction by a specific amount. The view data $G(-k,t)$ is then measured under the condition that the phase of spin within the body under diagnosis is twisted in the opposite direction to the aforementioned direction, and by an amount which is equal to the aforementioned amount. The time which elapses between the points at which the view data $G(k,t)$ and $G(-k,t)$ are respectively measured is made sufficiently short that the variation with time of the static magnetic field can be ignored.

The data $G(k,t_O)$ and the data $G(-k,-t_O)$ are then derived from the view data $G(k,t)$ and $G(-k,t)$, with respect to time points $t_O$ and $-t_O$ respectively, these time points being mutually symmetrically disposed with respect to the time origin of the view data.

The complex conjugate $\overline{G(-k,-t_O)}$ of the data $G(-k,-t_O)$ is then derived, together with the ratio of the data $G(k,t_O)$ and data $\overline{G(-k,-t_O)}$, i.e. the ratio $A = G(k,t_O)/\overline{G(-k,-t_O)}$.

The measured data is corrected by a signal which is proportional to the argument arg (A) of the ratio A.

BEST MODE FOR CARRYING OUT THE INVENTION

Figure 1:
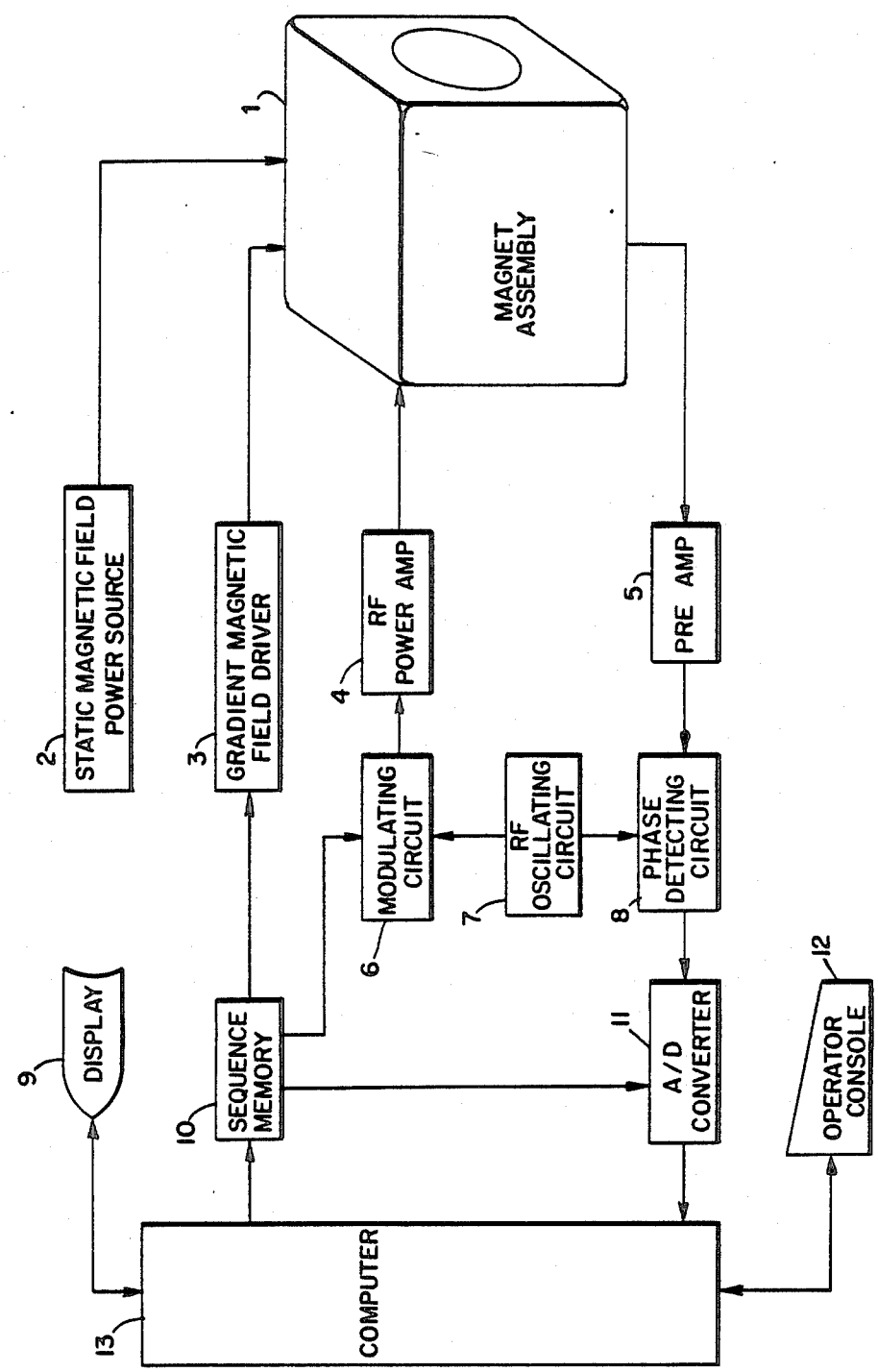
FIG. 1 is a diagram illustrating the general configuration of an embodiment of a nuclear magnetic resonance imaging apparatus according to the present invention.

An embodiment of the present invention will be described in detail, referring to the drawings. FIG. 1 is a general diagram illustrating an embodiment of the present invention. Within the interior of a magnet assembly 1 are disposed a static magnetic field coil, and three types of gradient magnetic field coil, for respectively generating gradient magnetic fields $G_x$, $G_y$ and $G_z$. The magnet assembly 1 also contains an RF transmitting coil, a reception coil for receiving the NMR signal, etc. The above components within the magnet assembly 1 are omitted from the drawing, and are respectively connected to a static magnetic field power source 2, a gradient magnetic field driver 3, a RF power amplifier 4 and a pre-amplifier 5.

The gradient magnetic field driver 3 and the RF power amplifier 4 generate a gradient magnetic field and a high-frequency (RF) magnetic field, respectively, within the interior of the magnet assembly 1, in a specific sequence. This sequence is determined by timing signals which are produced by a sequence memory 10. A modulator circuit 6 is controlled by the sequence memory 10, and serves to transmit the RF signal produced from an RF oscillator circuit 7 to the RF power amplifier 4 at specific timings, after modulating this RF signal to have a specific envelope and phase. The RF amplifier 4 applies this modulated RF signal to drive the RF transmitting coil. In this way, an NMR signal is obtained from the body which is under diagnosis (which is disposed within the interior of the magnet assembly 1), as a result of the applied gradient magnetic field and RF magnetic field. The NMR signal which is thus obtained is transferred through the pre-amplifier 5 to be detected by a phase detector circuit 8. The resultant output signal from phase detector circuit 8 is converted to a digital signal by an A/D converter 11. This digital signal is input to a computer 13, to be thereby converted into an image by specific processing which is performed by computer 13, in accordance with the scan sequence. This image is displayed on a display 9.

The computer 13 can alter the contents of the sequence memory 10, and thereby can execute a variety of different scan sequences. An operator console 12 serves as data input means, whereby an operator can input necessary data to the computer 13.

Figure 2:
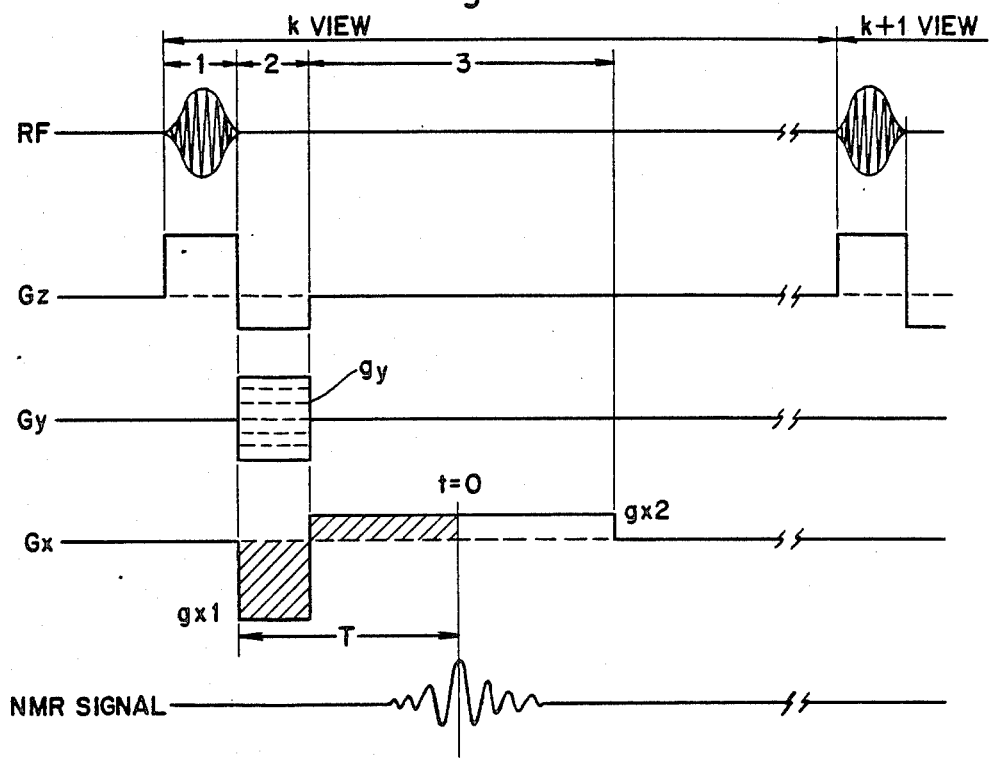
FIG. 2 and FIG. 3 are timing charts for illustrating the operation of the embodiment of FIG. 1, based on the spin warp imaging.

FIG. 2 shows an example of a pulse sequence which can be utilized with an apparatus according to the present invention. This pulse sequence is for the spin warp imaging, which is a Fourier transform imaging. With a Fourier transform imaging, excitation is applied to the body which is under diagnosis, and each measurement of the NMR signal is performed, taking a view in a specific direction, with a different amount of phase twist applied to the spin within the body which is under diagnosis. Normally, the amount of twist is set to a value of $2n\pi$ (where n is an integer) on both sides of the image region. In the following, the magnitude of the twist of the spin phase will be referred to as the warp amount. The spin warp imaging is based on variation of the warp amount by alteration of the amplitude $g_y$ of the gradient magnetic field $G_y$ for each view. This is illustrated in FIG. 2, in which the amplitude $g_y$ of the gradient magnetic field $G_y$ is drawn as a plurality of broken lines. During period 1 shown in FIG. 2, the gradient magnetic field $G_z$ performs selective excitation of a slice plane, in response to an RF pulse. During period 2, preparation (dephasing) is carried out for measurement of the warp resulting from the gradient magnetic field $G_y$ and the echo signal resulting from the gradient magnetic field $G_x$. In period 3, the echo signal resulting from the gradient magnetic field $G_x$ is measured. Here, $$|g_{x1}| \times (\text{period 2}) = |g_{x2}| \times (\text{period 3}) \times \tfrac{1}{2}.$$

The measurement data G(k,t) which is obtained by utilizing this Fourier transform imaging can be expressed in terms of a 2-dimensional Fourier transform image F(k,t) of the proton density distribution f(x, y), i.e. as:

$$G(k,t) = F(k,t) e^{-j\gamma \Delta B(k)(T+t)} \quad (1)$$

Here, k is the view number, t is time, T is the time interval which elapses from the time of completion of selective excitation until the time origin of the echo signal (t=0). (See FIG. 2) $\gamma$ is the magnetogyric ratio, $\Delta B(k)$ is the amount of change in the static magnetic field at the time of the k'th view.

In general, the 2-dimensional Fourier transform F(k,t) of a real function f(x,y) can be expressed as $$F(k,t) = \overline{F(-k,-t)} \quad (2)$$

Since the proton density distribution function is a real function, this relationship is applicable. Thus, equation (1) can be modified by equation (2) as follows:

$$G(k,t) = \overline{F(-k,-t)} e^{-j\gamma \Delta B(k)(T+t)} \quad (3)$$

On the other hand, the NMR signal is measured with the direction of twist of phase spin inverted, when the data G(−k,t) is obtained. If the time axis of this measurement data is reversed, and the complex conjugate is taken, then the following is obtained:

$$\overline{G(-k,-t)} = \overline{F(-k,-t)} e^{-j\gamma \Delta B(-k)(T-t)} = \overline{F(-k,-t)} e^{-j\gamma \Delta B(-k)(T-t)} \quad (4)$$

If the data G(k,t) and G(−k,t) are respectively measured at points in time which are sufficiently close, then the change in static magnetic field between the two times of measurement can be ignored. Assuming that $\Delta B(-k) = \Delta B(k)$, then from equation (4),:

$$\overline{G(-k,-t)} = \overline{F(-k,-t)} e^{-j\gamma \Delta B(-k)(T-t)} \quad (5)$$

and therefore:

$$\overline{F(-k,-t)} = \overline{G(-k,-t)} e^{-j\gamma \Delta B(-k)(T-t)} \quad (6)$$

Combining equation (6) with equation (3), :

$$G(k,t) = \overline{G(-k,-t)} \cdot e^{-j\gamma \Delta B(-k)(T-t)} \cdot e^{-j\gamma \Delta B(-k)(T-t)} = \overline{G(-k,-t)} e^{-j\gamma \Delta B(k) \cdot T} \quad (7)$$

therefore:

$$\Delta B(k) = -(\tfrac{1}{2}\gamma T) \cdot \arg(A) \quad (8)$$

In the above, $A = G(k,t)/\overline{G(-k,-t)}$, arg (A)=$\tan^{-1}$ (Im [A]/Re [A]). G(k,t) and G(−k,−t) are measured values, $\gamma$ is a constant, T is a known value, and hence $\Delta B(k)$ can be obtained. arg (A) is the argument of the complex number A. If the amount of variation of the static magnetic field is thus obtained, then the measured data can be compensated based on this amount of variation, by methods which are known in the art. The artifacts in the reconstructed image can thereby be eliminated.

In the above, idealized measurement of the amount of static magnetic field variation has been described. A practical method of measurement will now be described in the following.

Figure 4:
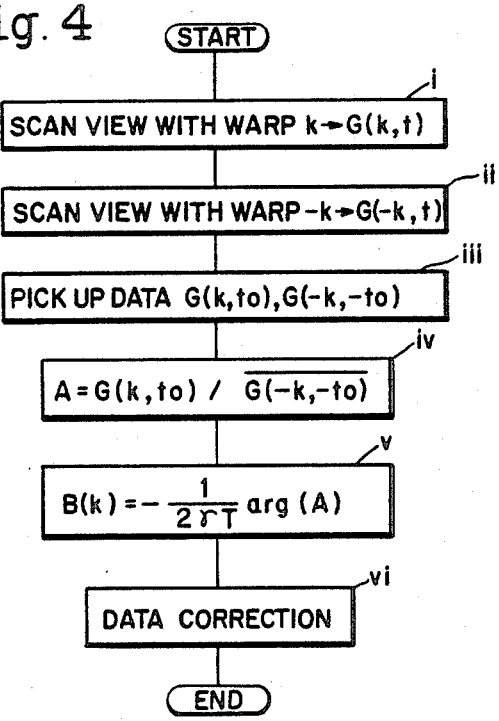
FIG. 4 is a flow chart for assistance in describing the operation of the apparatus of FIG. 1.
Figure 3:
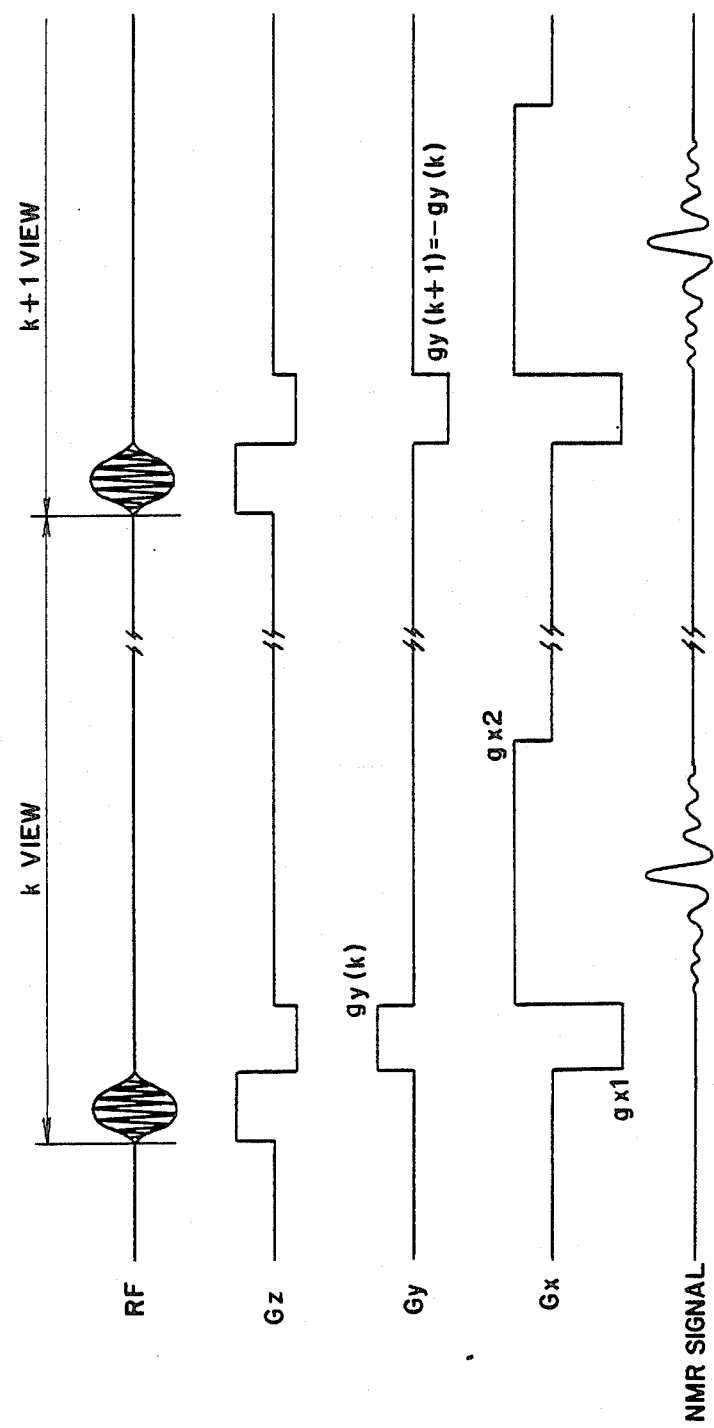

FIG. 3 shows a timing chart of a pulse sequence, while FIG. 4 is a flow chart to illustrate data processing which is carried out by the computer 13. As shown in FIG. 3, at the k'th view, designating the amplitude of variation of the gradient magnetic field $G_y$ as $g_y(k)$, the NMR signal is measured when the warp amount is k. At the next view, i.e. the (k+1)'th view, designating the amplitude of variation of the gradient magnetic field $G_y$ as $-g_y(k)$, the NMR signal is measured when the warp amount is −k. This procedure is possible due to the fact that the pulse sequence whereby measurement for each view is carried out is identical to the pulse sequence for the normal method of spin warp measurement. Thus, the measured data can be used to reconstruct images of the body which is under diagnosis.

In this way, the NMR signals thus measured are successively processed by the computer 13 as illustrated in the flow chart of FIG. 4. In block i of FIG. 4, the view data G(k,t) is measured when the warp amount becomes equal to k. In block ii, the view data G(−k,t) is measured when the warp amount becomes −k. In block iii, the data G(k,$t_O$) and G(−k,−$t_O$) are respectively derived for the time points $t_O$ and −$t_O$, from the view data G(k,t) and G(−k,t), with the time points $t_O$ and −$t_O$ being mutually symmetrically disposed with respect to the time origin. In block iv, the ratio A of the conjugates of the complex quantities constituted by data G(k,$t_O$) and G(−k,−$t_O$) are computed. In block v, utilizing the value A computed in the preceding block, the amount of variation ΔB(k) of the static magnetic field is derived, by using equation (8) above. Based on the amount of variation of the static magnetic field ΔB(k) obtained for the k'th view, correction of the measurement data for that view is performed by employing a known method of correction. In block iii, the time origin of derivation of the data is defined as the point at which, when the distribution of the magnetic field is uniform, the phase coherence of spin within the body which is under diagnosis reaches a maximum value, for a specific amount of warp. This is because (referring to FIG. 2), the time origin is the point at which the value of the time integral of the gradient magnetic field waveform $g_{x2}$ in the third period becomes equal to the area of the magnetic field waveform $g_{xl}$ in period 2. This time point is inherently determined by the scan sequence. The time T which is used to compute ΔB(k) in block v corresponds to the time which elapses from the point of termination of selective excitation until the time origin. It should be noted that it is possible to use a pulse sequence for a Fourier transform imaging other than the spin warp imaging, so long as the value of T that is utilized is identical for each of the measured data G(k,t) and G(−k,t).

It should also be noted that the present invention is not limited to the embodiment described above, and that the following modifications thereto are possible:

(I) Due to the fact that the static magnetic field generally varies in a gradual manner, it is not necessary that the two views having the warp amounts k and −k be taken in immediately consecutive scans. That is to say, it is possible to allow a time interval to elapse before taking these two views, so long as the duration of this interval is sufficiently short that the amount of variation in the static magnetic field occurring during the interval can be ignored.

(II) For the above reason, it is not necessary to measure the static magnetic field for all of the view pairs. In actual practice, the NMR signal will be of low amplitude in the case of a view for which there is a large absolute value of the warp amount, so that it is difficult in such a case to perform accurate measurement of the static magnetic field. However it is possible to measure the variations in static magnetic field only for views for which the warp amount is small, with these views being taken at approximately uniformly spaced intervals throughout an entire scan, and to interpolate values for static magnetic field variation for other views on the basis of these measured values. The sequence of views should be as follows:

warp amount 0, 2π, −2π, . . . , +6π, −6π, . . . , +4π, −4π, . . . , +8π, −8π

(III) The present invention is not limited to the spin warp imaging, but can be employed with any pulse sequence so long as a Fourier transform imaging is utilized.

(IV) It is also possible to select, from data pairs derived from the view data G(k,t) and G(−k,t), with respect to time points mutually symmetrically disposed with respect to the time origin of measurement, only those data pairs corresponding to time points of higher powers. The value of arg (G/$\overline{G}$) for each of this plurality of data pairs can then be derived, and the average of these values of arg (G/$\overline{G}$) can be employed to derive the value of ΔB(k). This will enable the accuracy of measurement of ΔB(k) to be increased.

The most effective manner of implementing the present invention has been described in the above. However it would be possible for one skilled in the art to devise various modifications to the above which will fall within the scope of the present invention, as set out in the appended claims.

We claim:

1. A method of nuclear magnetic resonance imaging employing the Fourier transform imaging, comprising the steps of:

measuring the view data G(k,t) for the body which is under diagnosis, under the condition that there is a specific value of twist of spin phase within said body, in a specific direction;

measuring the view data G(−k,t) for the body which is under diagnosis, under the condition that the value of twist of the spin phase within said body is equal in amount and of opposite direction to the aforementioned value of twist of spin phase, with the time which elapses between said measurements of G(k,t) and G(−k,t) being sufficiently short that any change in the static magnetic field occurring therein can be ignored;

deriving from said view data G(k,t) and G(−k,t) the data G(k,$t_O$) and G(−k,−$t_O$), for the respective time points $t_O$ and −$t_O$ which are mutually symmetrically disposed with respect to the time origin of said view data G(k,t) and G(−k,t);

deriving the complex conjugate $\overline{G(-k,-t_O)}$ of the data G(−k,−$t_O$);

deriving a value A which is the ratio G(k,$t_O$)/$\overline{G(-k,-t_O)}$, and;

correcting measured data by a signal which is proportional to the argument arg(A) of the ratio A.

2. A method of nuclear magnetic resonance imaging according to claim 1, in which the proportional constant of said signal employed for correction of measured data is −1/(2γT), where γ is the magnetogyric ratio of spin and T is the time which elapses from the point of termination of selective excitation of spin until the time origin of measurement.

3. A method of nuclear magnetic resonance imaging according to claim 1, in which said measurement of view data G(k,t) and G(−k,t) is performed by taking a plurality of measurements, each taken under the condition that the amount of twist of spin phase is small, with the times at which said plurality of measurements are made being substantially uniformly dispersed throughout a scan sequence.

4. A method of nuclear magnetic resonance imaging according to claim 1, in which said measurements of view data $G(k,t)$ and $G(-k,t)$ are performed consecutively.

5. A method of nuclear magnetic resonance imaging according to claim 1, in which, in said derivation of data $G(k,t_O)$ and $G(-k,-t_O)$ for the time points $t_O$ and $-t_O$ which are mutually symmetrically disposed with respect to the time origin, a plurality of pairs of said data values $G(k,t_O)$ and $G(-k,-t_O)$ are derived for respectively different values of $t_O$, with said signal used to correct measured data being made proportional to the average value of the arguments $\arg(A)$ which are obtained based on said plurality of pairs of data values.

6. A method of nuclear magnetic resonance imaging according to claim 1, in which the spin warp imaging is employed with the Fourier transform imaging.

7. An apparatus for nuclear magnetic resonance imaging, comprising:

means for measuring the view data $G(k,t)$ for a body which is under diagnosis, under the condition that there is a specific amount of twist of the spin phase within said body in a specific direction, and for measuring the view data $G(-k,t)$ for the body which is under diagnosis, under the condition that the value of twist of the spin phase within said body is equal in amount and of opposite direction to the aforementioned value of twist of spin phase, with the time which elapses between said measurements of $G(k,t)$ and $G(-k,t)$ being made sufficiently short that any change in static magnetic field occurring therein can be ignored;

means for deriving from the view data $G(k,t)$ and $G(-k,t)$ the data $G(k,t_O)$ and $G(-k,-t_O)$, for the respective time points $t_O$ and $-t_O$ which are mutually symmetrically disposed with respect to the time origin of said view data $G(k,t)$ and $G(-k,t)$;

means for deriving the complex conjugate $\overline{G(-k,-t_O)}$ of the data $G(-k,-t_O)$;

means for deriving a value A which is the ratio $G(k,t_O)/\overline{G(-k,-t_O)}$, and;

means for correcting measured data by a signal which is proportional to the argument $\arg(A)$ of the ratio A.

8. An apparatus for nuclear magnetic resonance imaging according to claim 7, in which the proportional constant of said signal employed for correction of measured data is $-1/(2\gamma T)$, where $\gamma$ is the magnetogyric ratio of spin and T is the time which elapses from the point of termination of selective excitation of spin until the time origin of measurement.

9. An apparatus for nuclear magnetic resonance imaging according to claim 7, in which said means for measurement of view data $G(k,t)$ and $G(-k,t)$ acts to perform a plurality of measurements, each taken under the condition that the amount of twist of spin phase is small, with the times at which said plurality of measurements are made being substantially uniformly dispersed throughout a scan sequence.

10. An apparatus for nuclear magnetic resonance imaging according to claim 7, in which said means for measurement of view data $G(k,t)$ and $G(-k,t)$ acts to perform said measurements of $G(k,t)$ and $G(-k,t)$ consecutively.

11. An apparatus for nuclear magnetic resonance imaging according to claim 7, in which, in said means for correction of measured data, which derives data $G(k,t_O)$ and $G(-k,-t_O)$ for time points $t_O$ and $-t_O$ that are mutually symmetrically disposed with respect to the time origin, acts to derive a plurality of pairs of said data values $G(k,t_O)$ and $G(-k,-t_O)$ for respectively different values of $t_O$, and causes said signal used to correct measured data to be made proportional to the average value of the arguments $\arg(A)$ which are obtained based on said plurality of pairs of data values.

12. An apparatus for nuclear magnetic resonance imaging according to claim 7, in which said Fourier transform imaging scan sequence means comprise sequence means for the spin warp imaging.

* * * * *